United States

Key et al.

4,187,421

Feb. 5, 1980

[54] OPTICAL RELAY

[75] Inventors: Paul F. Key, San Martin; Anthony R. Lazzara, Portola Valley, both of Calif.

[73] Assignee: Scientific Technology Inc., Mountain View, Calif.

[21] Appl. No.: 778,883

[22] Filed: Mar. 18, 1977

[51] Int. Cl.$^2$ .............................................. H04B 9/00
[52] U.S. Cl. ..................................................... 250/199
[58] Field of Search ................. 250/199; 356/141, 152

[56] References Cited

U.S. PATENT DOCUMENTS

| | | | |
|---|---|---|---|
| 2,404,696 | 7/1946 | Deal | 250/199 |
| 2,494,645 | 1/1950 | Collins | 250/199 |
| 3,506,834 | 4/1970 | Buchsbaum et al. | 250/199 |
| 3,566,126 | 2/1971 | Lang et al. | 250/199 |
| 3,727,061 | 4/1973 | Dworkin | 250/199 |
| 3,778,616 | 12/1973 | Ranniger | 250/199 |
| 3,801,819 | 4/1974 | Ohnsorge | 250/199 |
| 3,867,628 | 2/1975 | Brown | 250/214 R |
| 3,899,430 | 8/1975 | Ancker-Johnson | 250/199 |
| 4,019,048 | 4/1977 | Maione et al. | 250/199 |

*Primary Examiner*—Robert L. Griffin
*Assistant Examiner*—Joseph A. Orsino, Jr.

[57] ABSTRACT

A relay for electromagnetic radiation occurring in the optical portion of the electromagnetic spectrum has a receiver and a transmitter. The receiver senses a propagated beam of electromagnetic radiation providing a signal corresponding thereto which is shaped in an electrical circuit and provided as an excitation signal to the transmitter. An audio alignment feature is included providing audio indications for alignment of the receiver with the beam of electromagnetic radiation which is to be relayed. The transmitter is directionally adjustable to provide a relayed beam of electromagnetic radiation in a direction different from the received beam. The method includes aligning the receiver with the beam of electromagnetic radiation and converting the received electromagnetic radiation beam to a corresponding electrical signal in the receiver. The method further includes exciting the electromagnetic radiation transmitter with the corresponding electrical signal so that the range of the received electromagnetic radiation beam is extended to include the sum of the ranges of the received and transmitted beams.

8 Claims, 7 Drawing Figures

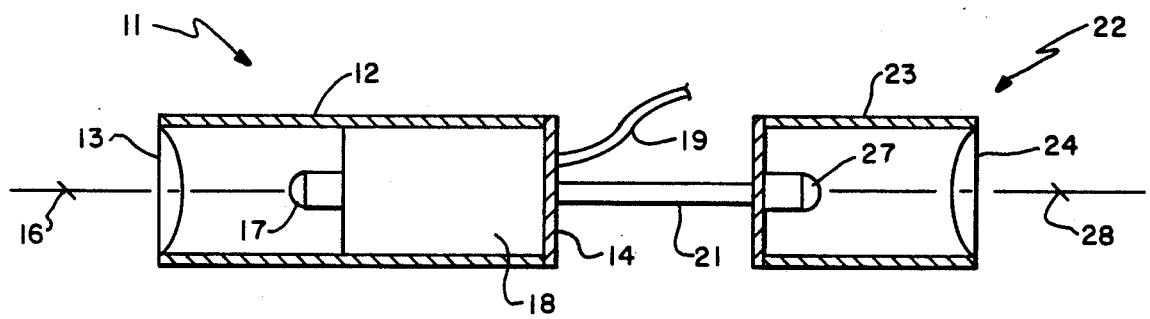
FIG.—1
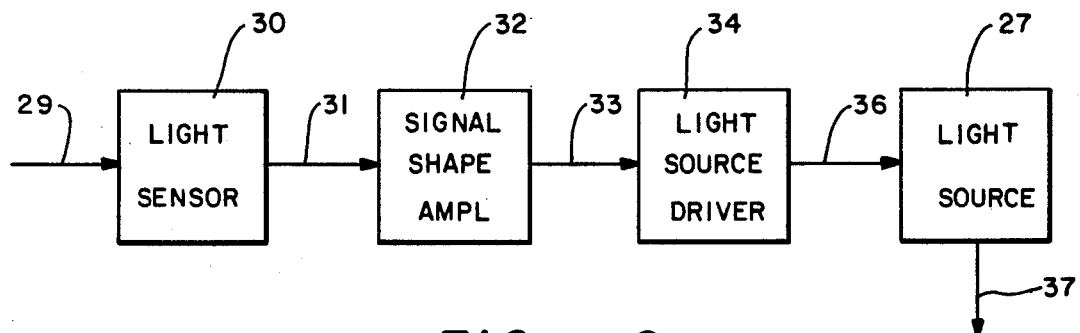
FIG.—2
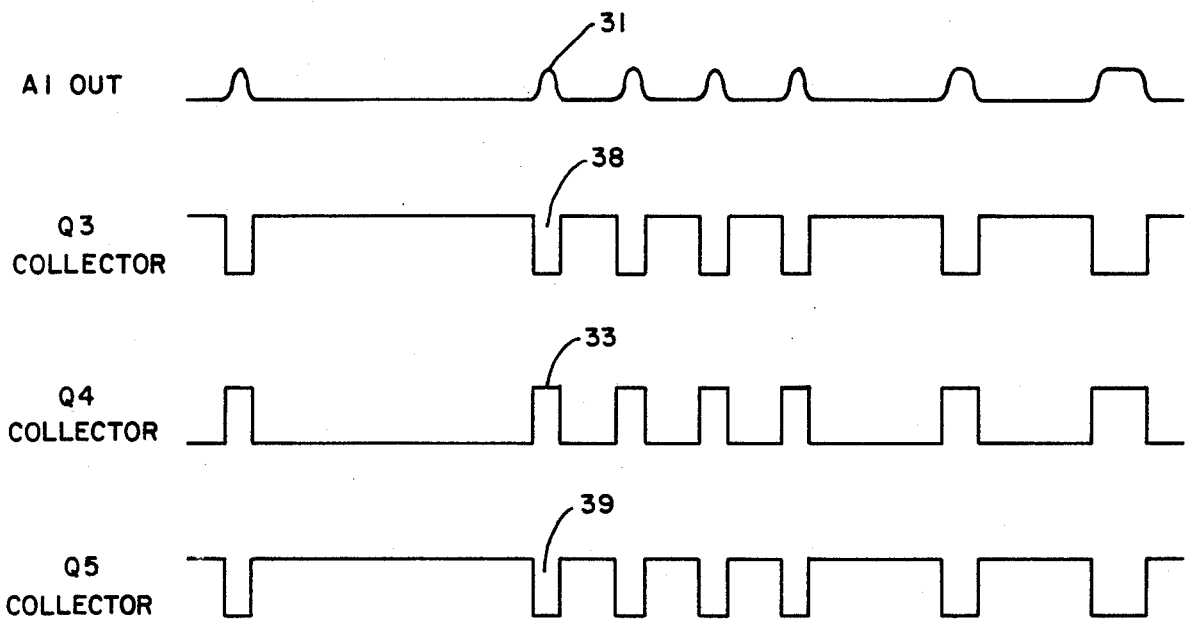
FIG.—4

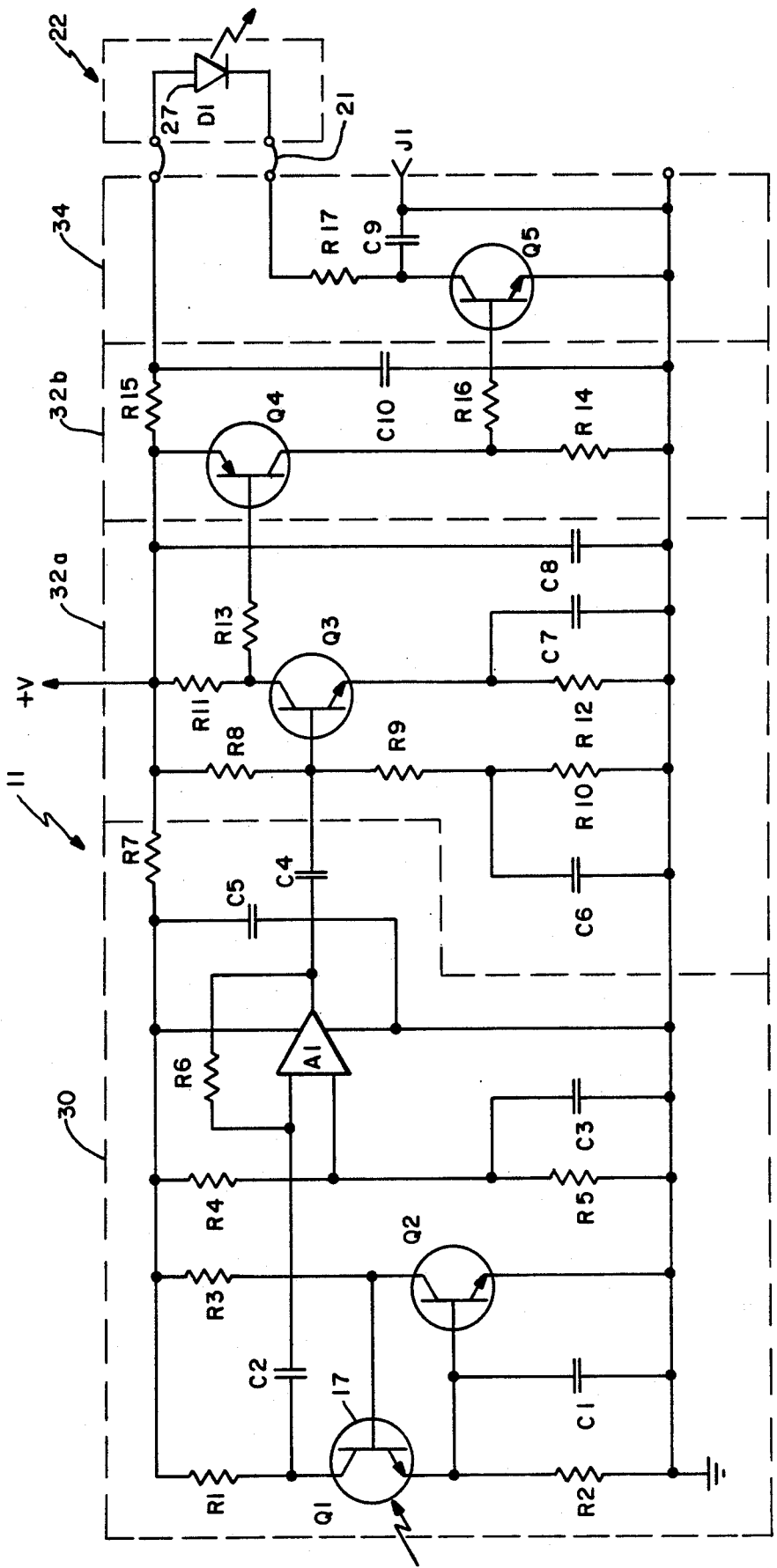
FIG.—3

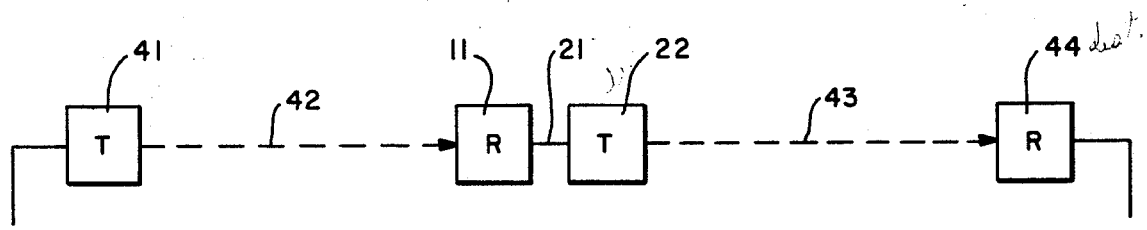
FIG.—5
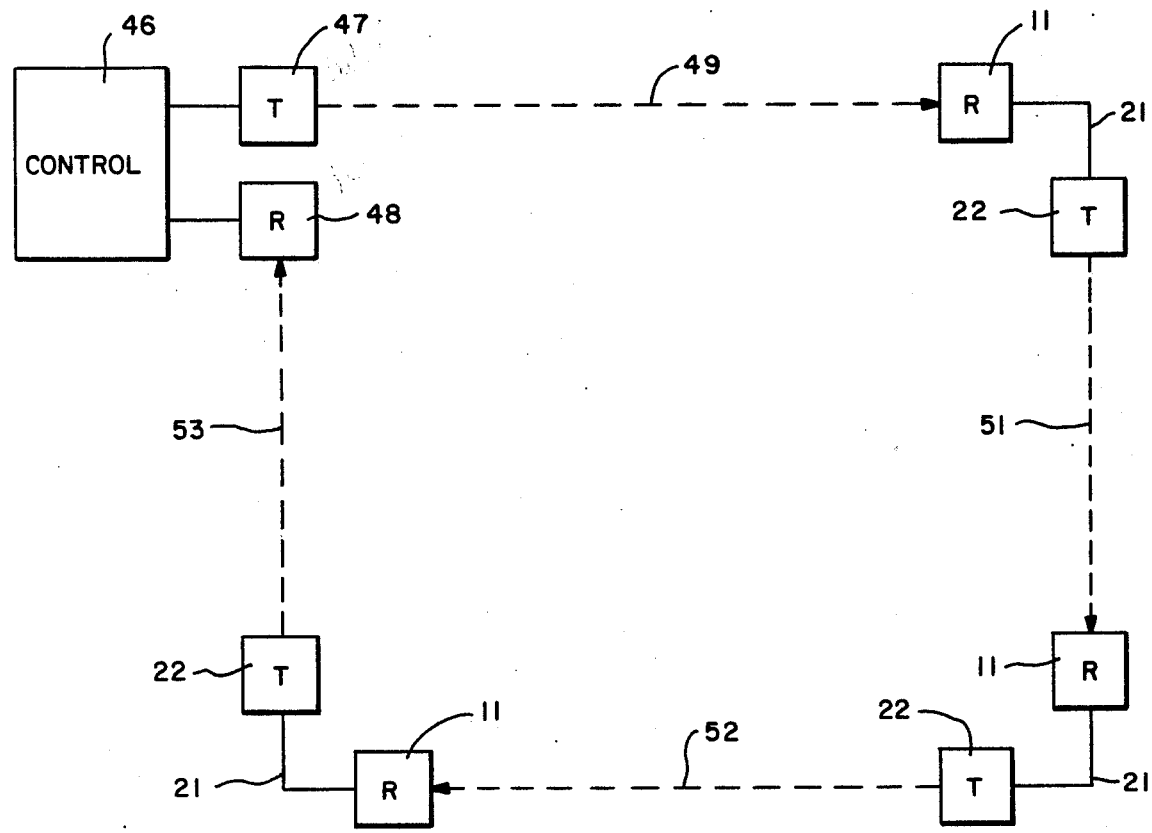
FIG.—6
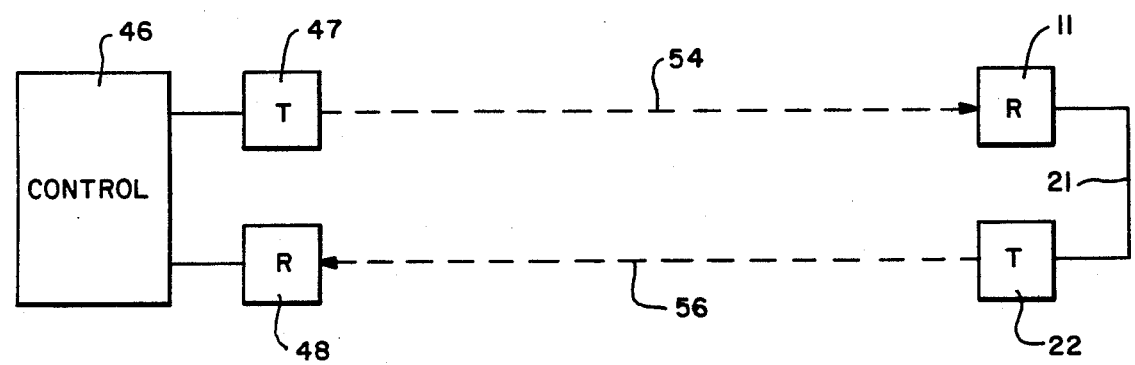
FIG.—7

OPTICAL RELAY

BACKGROUND OF THE INVENTION

This invention relates to a receiving and transmitting combination for electromagnetic radiation beams in the optical portion of the electromagnetic spectrum, and more particularly to such a device for use in optical information transmission systems.

Optical information transmission has been hampered in the past by range limitations imposed due to rapid dissipation of the optical information in transit from a transmitter to a receiver. High ambient optical radiation background further hampers reception and causes the problem of discriminating between background radiation and transmitted electromagnetic radiation information. Certain applications for transmission of electromagnetic radiation in the optical portion of the spectrum present circumstances where running lengths of electrical cabling is inconvenient or impractical. Further, transmission of information optically is limited to line of sight and objects opaque to the transmitted radiation prevent information flow. Therefore, apparatus and method are desirable for extending the range of transmitted optical information in the presence of high ambient optical radiation background, as well as apparatus and method eliminating cabling and allowing redirection of transmitted optical radiation en-route to its ultimate destination.

SUMMARY AND OBJECTS OF THE INVENTION

The optical relay disclosed herein includes means which receive the electromagnetic radiation in the optical portion of the electromagnetic spectrum and which provide an output signal corresponding to the received electromagnetic radiation. A source driver is coupled to receive the output signal, which provides a driver signal in response thereto. A source of electromagnetic radiation is connected to the driver signal so that when an input pulse of electromagnetic radiation is received at the receiver, an output pulse of electromagnetic radiation is produced at the source. The output pulse is substantially in phase with the received pulse. A method of extending the range of a directional beam of electromagnetic radiation in the optical spectrum is disclosed which includes the step of aligning an optical beam receiver with a directional optical beam to be relayed. Converting the directional optical beam to a corresponding electrical signal when received is followed by exciting a connected optical beam transmitter with the corresponding electrical signal. The connected transmitter produces a directional optical beam extending the range of the received optical beam to the sum of the ranges of the received and transmitted optical beams.

In general it is an object of the present invention to provide a relay for transmitted optical information which extends the range of transmission.

Another object of the present invention is to provide a relay for transmitted optical information which redirects the information along a direction different from the direction of the received information beam.

Another object of the present invention is to provide a relay for transmitted optical information wherein electrical conducting cables in parallel with the optical beams are unnecessary.

Another object of the present invention is to provide a relay for transmitted optical information which will relay the optical information in the presence of high ambient levels of optical radiation.

Another object of the present invention is to provide a relay for transmitted optical information which is easily aligned with the beam of optical information to be relayed.

Additional objects and features of the invention will appear from the following description in which the preferred embodiment has been set forth in detail in conjunction with the accompanying drawings.

BRIEF DESCRIPTION OF THE DRAWINGS

FIG. 1 is a sectional side elevation view of the optical relay.

FIG. 2 is a block diagram of the optical relay.

FIG. 3 is an electrical schematic diagram of the optical relay.

FIG. 4 is a signal timing diagram for the optical relay.

FIG. 5 is a block diagram showing one use for the optical relay.

FIG. 6 is a block diagram showing another use for the optical relay.

FIG. 7 is a block diagram showing yet another use for the optical relay.

DESCRIPTION OF THE PREFERRED EMBODIMENT

Preliminary to undertaking the disclosure which follows, several definitions are offered which will be used throughout this disclosure. The apparatus and method relate to relaying electromagnetic radiation within that portion of the electromagnetic spectrum extending from the far infra-red, having a propagation wave length of approximately 100,000 Angstroms (Å) to the hard ultraviolet having a propagation wave length of approximately 100 Å. This band extending from far infra-red to hard ultra-violet is defined as the optical spectrum for the purpose of this disclosure. Included within the optical spectrum is what we know as the visible light portion between propagation wave lengths of 7,000 to 4,000 Å. Electromagnetic radiation within the optical spectrum will be referred to as "light".

There are three types of frequencies of interest used herein. First, there is the light propagation frequency corresponding to the propagation wave lengths described for the optical spectrum above. Second, there are the light pulse component frequencies which depend upon the width of the light pulse. The narrower the light pulse width the higher the light pulse component frequencies will be. Third, there is the light pulse repetition rate, which describes the number of times in a given period of time the pulse is repeated. These three frequencies may be seen to be independent for the purpose of this discussion.

Turning now to FIG. 1, a light sensor or light receiver 11 is shown having an open ended outer case 12 with a lense 13 disposed in one end and an end cover 14 disposed in the other end. Lens 13 is configured to receive an incoming beam of electromagnetic energy or light along axis 16 and to focus the incoming beam of light on a light sensor 17 also located on axis 16. An electronic circuit package 18 is mounted within light receiver case 12 and is coupled electrically to light sensor 17. A power cable 19 is directed through end cover 14 to provide power for electronic circuitry package 18, and a connecting cable 21 leads through end cover 14 to enter an electromagnetic radiation or light transmitter 22. Light transmitter 22 has an outer case 23 with a lens 24 disposed in one open end and an end cover 26 disposed in the other. Interconnecting cable 21 passes through end cover 26 and is connected to a source of electromagnetic radiation, light transmitter 27. Light transmitter 27 may be a light emitting diode which is mounted on the inner surface of end cover 26, and is situated on an axis 28. Lens 24 is configured to direct electromagnetic radiation in the optical spectrum along axis 28.

Presently, solid state devices are used for light sensor 17 and light source 27, being sensitive to and emitting light respectively having propagation wave lengths in a range of 12,000 to 5,000 Å. Alternate means for receiving and transmitting directional electromagnetic radiation or light beams are envisioned, as long as they are sensitive to and produce light within the optical spectrum defined hereinabove.

FIG. 2 shows a block diagram wherein a directional light beam 29 is received at light sensing circuit 30 producing an output signal 31 indicative of the received light. An amplifier 32 is provided to receive output signal 31 and to provide a shaped output 33 closely resembling a square pulse. A light source driver 34 is provided receiving the shaped output pulse 33 and providing a driver pulse 36. Light source 27 is configured to receive driver pulse 36 and to provide a transmitted directional light beam 37 therefrom which may have a direction differing from that of directional light beam 29.

The electrical schematic diagram of FIG. 3 shows light sensor 17 as photo transistor Q1. The input directional light beam 29 impinges on photo transistor Q1 after passing through lens 13 of FIG. 1. The output of photo transistor Q1 is delivered to light sensing circuit 30 which is described in U.S. Pat. No. 3,867,628 commonly owned by the assignee of this application. As described therein resistor R3 has a high value, on the order of several megohms, and serves to bias photo transistor Q1 to the "on" condition when in complete darkness or complete absense of electromagnetic radiation levels. With photo transistor Q1 turned on, a base to emitter current flows and a higher level collector current flows in the emitter collector circuit of Q1. The collector current causes a drop across resistor R2 which biases transistor Q2 to a more conductive condition as collector current increases in photo transistor Q1. Concurrently, the voltage drop across resistor R2 increases. Transistor Q2 may be seen to form a feedback path between the emitter and base of photo transistor Q1, providing negative feedback for control of collector current through photo transistor Q1. A capacitor C1 in conjunction with resistor R2 forms a low pass filter circuit which attenuates signals at frequencies above the low pass band. Consequently, signals above the low pass band are bypassed at the base of transistor Q2 blocking the feedback to the base of photo transistor Q1. Thus, light pulse frequency components above the low pass band which are received by photo transistor Q1 cause output to appear at the collector of Q1 which is not compensated by the feedback path through transistor Q2. Conversely, collector current in photo transistor Q1 caused by light inputs at frequencies within the low pass band cause transistor Q2 to turn on and "sink" base current from photo transistor Q1 preventing output at the collector thereof.

As further described in the aforementioned U.S. patent, the collector at the output of photo transistor Q1 is capacitor coupled through C2 to an amplifier A1 which provides an output signal to an initial section 32A of the signal shaping and amplification circuit 32. Transistor Q3 is turned on by positive pulses received from amplifier A1 providing a negative going shaped wave at the collector thereof. A negative going signal at the collector of transistor Q3 is coupled to the base of transistor Q4 through resistor R13. Each pulse at the base of transistor Q4 turns the transistor on providing a positive going pulse at the collector thereof. Transistor Q4 is located in a subsequent portion of the signal shaping and amplification circuit 32, designated 32B in FIG. 3.

A positive going signal at the collector of transistor Q4 is connected from circuit section 32B through resistor R16 to the base of transistor Q5 in light source driver 34. Transistor Q5 is turned on by the positive going signals providing a conducting path from plus V through light emitting diode (LED) D1, representing electromagnetic radiation or light transmitting source 27, cable 21, resistor R17 and transistor Q5 to ground potential. Consequently, a transmitted light pulse from LED D1 is provided which is substantially in phase with a light pulse received at photo transistor Q1. In terms of the block diagram of FIG. 2, a pulse of electromagnetic energy in the optical spectrum 29 is processed and produces a relayed transmitted light pulse 37 substantially in phase therewith from the electromagnetic radiation source or light transmitter 27.

A timing diagram of FIG. 4 shows the output signal 31 from amplifier A1 in light sensing circuit 30. Output signal 38 at the collector of transistor Q3 is shown to be in time coincidence with output signal 31. Output at the collector of transistor Q4 is shown as the shaped and amplified signal 33 which is connected to the input of light source driver 34 at the base of transistor Q5. A signal 39 is shown occurring at the collector of transistor Q5 which may be seen from the circuit of light source driver 34 to represent excitation of light emitting diode D1 when in the negative going condition. FIG. 4 amply demonstrates the in phase condition between receiver output 31 and light source driver signal 39. Moreover, FIG. 4 shows that optical information may be transmitted in a coded form utilizing transmitted pulse separation time, transmitted pulse frequency and transmitted pulse width. Time delay between the received and relayed directional light beams 29 and 37 respectively has been calculated to be approximately 5 microseconds.

FIG. 5 shows the disclosed apparatus used for the purpose of extending the range of a transmitted directional beam of electromagnetic energy in the optical spectrum. An initial transmitter 41 transmits a directional light beam 42 directed toward light sensing receiver 11. Received light beam 42 is sensed, an output signal corresponding thereto is produced, the output signal is conditioned to form an excitation signal, and the excitation signal is coupled to a light transmitting assembly 22 through a conducting cable 21. When excited, light transmitting assembly 22 transmits a relayed directional light beam 43 toward a destination receiver 44. It may be seen from FIG. 5 that the range of transmitter 41 has been extended to now include the sum of the ranges of initial transmitter 41 and light transmitting assembly 22. In this manner the optical information transmitted by initial transmitter 41 has been relayed to be received by the destination receiver 44.

Returning momentarily to FIG. 3, a jack J1 is seen on light source driver 34. The position of jack J1 as shown in FIG. 3 is not essential, as the jack would be coupled by a capacitor such as C9 to the collector of either transistors Q3 or Q4. When light pulses are transmitted to impinge on photo transistor Q1 at a pulse repetition rate within the audio range, an audio pulse frequency is present at jack J1. Connection of jack J1 to an audio earphone will produce an audible sound in accordance with the pulse repetition rate. In this fashion light sensing and receiving assembly 11 may be aligned to receive a transmitted directional light beam by orienting case 12 until maximum audible sound in the earphone is produced. It should also be noted that if the pulse repetition rate is not within the audible range, a multiplier or a divider circuit section (not shown) could be coupled between one of the circuit sections in light sensing and receiving assembly 11 and jack J1 to provide a frequency output within the audible range for alignment purposes.

FIG. 6 shows another use for the optical relay when the periphery of an area is required to be scanned for security purposes. A control circuit 46 is shown, which may be of any type for coupling to another initial transmitter 47 and another destination receiver 48. Control circuit 46 produces a pulse which excites initial transmitter 47 and results in the emission of a directional light beam 49. Three sets of light sensing and receiver assemblies together with light transmission assemblies are shown receiving directional light beam 49, producing relayed directional light beam 51, receiving light beam 51 and producing relayed directional light beam 52, receiving light beam 52 and producing relayed directional light beam 53 respectively. In this fashion a four sided area bounded by light beams 49, 51 52 and 53 is enclosed without the necessity of running long lengths of electrically conducting cables from control 46 to each corner of the enclosed area. Alignment of the various sets of light sensing and receiver assembly 11 together with light transmitting assembly 22 is facilitated by the audio alignment feature described above.

FIG. 7 shows yet another use for the optical relay including light sensing and receiving assembly 11 and light transmitting assembly 22. The control circuit 46 and initial transmitting and destination receivers 47 and 48 respectively are shown as in FIG. 6. Initial transmitter 47 produces a transmitted light beam 54 when excited by control 46. Receiver 11, being aligned to receive transmitted light beam 54, produces a relayed directional light beam 56 to be received by destination receiver 48. The optical relay including light sensing and receiving assembly 11 and light transmitting assembly 22 thereby serves as an active retro-target, again eliminating the need for long electrical conducting cables.

The method of relaying and extending the range of a transmitted directional optical beam which is emitted by an optical beam transmitter includes aligning the optical beam receiver 11 with the transmitted directional optical beam. Thereafter the method includes converting the directional optical beam to a corresponding electrical signal in the receiver 11. Another optical beam transmitter 22 is coupled to the receiver 11 which is excited by the corresponding electrical signal to produce a relayed directional optical beam. In this fashion the range of the originally transmitted directional optical beam is increased to the sum of the ranges of the transmitter for the original optical beam and the range of the optical beam transmitter 22. When the originally transmitted optical beam is in the form of a pulsed beam wherein the pulse widths are less than a predetermined maximum pulse width, the method further includes the step of discriminating between the pulses in the transmitted directional optical beam and ambient background optical radiation.

An optical relay has been disclosed for a transmission of optical information at propagation frequencies within the optical spectrum, in pulses having widths less than a predetermined maximum width to keep the pulse frequency components above a minimum frequency, and at pulse repetition rates and widths which carry the information in optically coded form over extended ranges without the necessity of parallel electrical cabling.

What is claimed is:
1. Apparatus for relaying a directional electromagnetic radiation beam containing pulse frequency components above a predetermined frequency, said apparatus comprising:
    (a) movable means for receiving said radiation beams and producing a shaped electrical signal in response to and substantially in phase with said pulse frequency components, said receiving means being insensitive to electromagnetic pulse components below said predetermined frequency;
    (b) electromagnetic radiation source driving means coupled to said receiving means for providing an electrical drive signal in response to and substantially in phase with said shaped signal;
    (c) an electromagnetic radiation source coupled to said driving means and responsive to said drive signal for producing a pulsating output beam of electromagnetic radiation at substantially the same frequency as and substantially in phase with said received pulse frequency components; and
    (d) means responsive to one of said electrical signals for producing an audio output signal having a frequency dependent upon said one signal and having a maximum amplitude when said receiving means is aligned with said beam said lastnamed means including means for producing said audio signal even if the frequency components are not within the audio range and a jack removably connectable in circuit with said receiving means.

2. Apparatus as in claim 1 including flexible cable means for positioning said source so as to direct said pulsating output in different directions.

3. Apparatus as in claim 1 wherein said electromagnetic radiation is infrared.

4. Apparatus as in claim 1 wherein said one signal has a frequency within the audible range and wherein said audio output signal has the same frequency as that of said one signal.

5. A method of relaying a directional electromagnetic radiation beam containing pulse frequency components above a predetermined frequency, said method comprising:
    (a) receiving said radiation beams at a movable receiver and producing a shaped electrical signal in response to and substantially in phase with said pulse frequency components;
    (b) converting said shaped output signal to an electrical drive signal substantially in phase with said shaped signal;
    (c) coupling said drive signal to an electromagnetic radiation source and a pulsating output beam of electromagnetic radiation at substantially the same frequency as and substantially in phase with said received pulse frequency components;
(d) aligning said receiver with said beam by producing an audio output signal in response to one of said electrical signals, said audio signal having a frequency dependent upon said one signal and having a maximum amplitude when said receiver is aligned with said beam, said audio signal being produced even if the frequency of said received pulse frequency components is not within the audible range; and
(e) moving said receiver while listening for maximum amplitude of said audio signal.

6. A method as in claim 5 including the step of discriminating between pulse frequency components above and below said predetermined frequency at said receiver for producing a shaped signal only in response to components above said predetermined frequency.

7. A method as in claim 5 including the step of connecting a jack in circuit with said receiver for listening to said audible signal.

8. A method as in claim 5 wherein said one signal has a frequency within the audible range and wherein said audio output signal has the same frequency as that of said one signal.

* * * * *